(12) United States Patent
Haag et al.

(10) Patent No.: US 6,700,393 B2
(45) Date of Patent: Mar. 2, 2004

(54) CAPACITIVE SENSOR ASSEMBLY FOR USE IN A NON-CONTACT OBSTACLE DETECTION SYSTEM

(75) Inventors: Ronald Helmut Haag, Clarkston, MI (US); Brian Deplae, Warren, MI (US); Jeremy M. Husic, Washington, MI (US); John Pasiecznik, Jr., Malibu, CA (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/142,680

(22) Filed: May 10, 2002

(65) Prior Publication Data

US 2003/0071640 A1 Apr. 17, 2003

Related U.S. Application Data

(60) Provisional application No. 60/361,803, filed on Mar. 5, 2002, provisional application No. 60/330,173, filed on Oct. 17, 2001, and provisional application No. 60/330,171, filed on Oct. 17, 2001.

(51) Int. Cl.[7] .............................................. G01R 27/26
(52) U.S. Cl. ...................... 324/674; 324/658; 324/660; 324/686
(58) Field of Search ................................ 324/674, 658, 324/660, 661, 686

(56) References Cited

U.S. PATENT DOCUMENTS

| | | | |
|---|---|---|---|
| 4,327,323 A | 4/1982 | Walker | 324/61 |
| 4,351,016 A | 9/1982 | Felbinger | 361/181 |
| 4,410,843 A | 10/1983 | Sauer et al. | 318/317 |
| 4,453,112 A | 6/1984 | Sauer et al. | 318/281 |
| 5,027,552 A | 7/1991 | Miller et al. | 49/27 |
| 5,089,672 A | 2/1992 | Miller | 200/61.43 |
| 5,287,086 A | 2/1994 | Gibb | 340/618 |
| 5,296,658 A | 3/1994 | Kramer et al. | 200/61.43 |
| 5,327,680 A | 7/1994 | Miller | 49/27 |
| 5,394,292 A | 2/1995 | Hayashida | 361/179 |
| 5,428,923 A | 7/1995 | Waggamon | 49/28 |
| 5,463,378 A | 10/1995 | Gibb | 340/618 |

(List continued on next page.)

OTHER PUBLICATIONS http://www.hunting.co.uk/info/ddctheory.htm: Digital Down Conversion (DDC) Theory, pp1–6, Jan. 3, 2002.
U.S. patent application Ser. No. 10/142,641, filed May 20, 2002 and entitled Method and Apparatus for Detecting a Change in Capacitance of a Capacitive Proximity Sensor, attorney docket No. DP–306074.
U.S. patent application Ser. No. 10/142,643, filed May 10, 2002 and entitled Flexible Capacitive Strip for use in a Non–Contact Obstacle Detection System, attorney docket No. DP–304424.
U.S. patent application Ser. No. 10/143,141, filed May 10, 2002 and entitled Non–Contact Obstacle Detecion System Utilizing Ultra Sensitive Capacitive Sensing, attorney docket No. DP–304425.
International Search Report for PCT/US02/32584, Dec. 9, 2002, 1 page.

*Primary Examiner*—N. Le
*Assistant Examiner*—John Teresinski
(74) *Attorney, Agent, or Firm*—Scott A. McBain (57) ABSTRACT

A capacitive sensor assembly is disclosed. In an exemplary embodiment, the assembly includes a capacitive strip having an elongated body for flexible mounting to a panel along a bottom surface of the elongated body. A first elongated planar conductor is contained within an upper section of the elongated body, while a longitudinal cavity is formed through a central portion of the elongated body. The longitudinal cavity is disposed between the planar conductor and the bottom surface. A capacitance detector module is inserted within the longitudinal cavity, the capacitance detector module including a capacitance detector circuit therein that is coupled to the first elongated planar conductor.

21 Claims, 4 Drawing Sheets

U.S. PATENT DOCUMENTS

| | | | |
|---|---|---|---|
| 5,473,461 A | 12/1995 | Miremadi | 359/189 |
| 5,484,477 A | 1/1996 | George et al. | 106/499 |
| 5,651,044 A | 7/1997 | Klotz, Jr. et al. | 378/117 |
| 5,790,107 A | 8/1998 | Kasser et al. | 345/174 |
| 5,801,340 A | 9/1998 | Peter | 178/19 |
| 5,832,772 A | 11/1998 | McEwan | 73/290 |
| 6,006,386 A * | 12/1999 | Mohaupt | 73/862.68 |
| 6,025,782 A | 2/2000 | Newham | 340/573.1 |
| 6,078,014 A | 6/2000 | Kashiwazaki et al. | 200/61.43 |
| 6,158,170 A | 12/2000 | Brodowsky | 49/28 |
| 6,166,381 A | 12/2000 | Augeri et al. | 250/332 |
| 6,229,408 B1 | 5/2001 | Jovanovich et al. | 333/167 |
| 6,263,199 B1 | 7/2001 | Wortel et al. | 455/333 |
| 6,275,048 B1 * | 8/2001 | Milli | 324/690 |
| 6,282,413 B1 | 8/2001 | Baltus | 455/260 |
| 6,288,640 B1 | 9/2001 | Gagnon | 340/539 |
| 6,297,605 B1 | 10/2001 | Butler et al. | 318/466 |
| 6,321,071 B1 | 11/2001 | Pekkarinen et al. | 455/115 |
| 6,348,862 B1 | 2/2002 | McDonnell et al. | 340/562 |
| 6,377,009 B1 | 4/2002 | Philipp | 318/468 |
| 6,429,782 B2 | 8/2002 | Pavatich et al. | 340/686 |
| 6,455,839 B1 | 9/2002 | O'Connor et al. | 250/221 |
| 6,499,359 B1 * | 12/2002 | Washeleski et al. | 73/862.473 |

* cited by examiner

CAPACITIVE SENSOR ASSEMBLY FOR USE IN A NON-CONTACT OBSTACLE DETECTION SYSTEM

CROSS REFERENCE TO RELATED APPLICATIONS

This application claims the benefit of U.S. provisional application No. 60/330,171, filed Oct. 17, 2001, the contents of which are incorporated by reference herein in their entirety.

This application further claims the benefit of U.S. provisional application No. 60/330,173, filed Oct. 17, 2001, the contents of which are incorporated by reference herein in their entirety.

This application further claims the benefit of U.S. provisional application No. 60/361,803, filed Mar. 5, 2002, the contents of which are incorporated by reference herein in their entirety.

BACKGROUND

The present disclosure relates generally to proximity detecting systems and, more particularly, to a capacitive sensor assembly for use in a non-contact obstacle detection system, such as may be implemented in conjunction with a motor vehicle power lift-gate, power operated device, or perimeter system.

Various systems have been devised for detecting obstacles in the path of a moveable panel such as an automotive power window, power sliding door or power hinged door. When an obstacle is detected, forward movement (e.g., closing) of the panel is interrupted and, optionally, the movement of the panel may be thereafter reversed (e.g., opened). These detection systems may generally be characterized as either "contacting" or "non-contacting". In a contacting system, an obstacle is detected only after some form of physical contact occurs between the panel and the obstacle, and may include devices such as pneumatic/pressure sensitive strips, or possibly sensors responsive to changes in mechanical or electrical loading in the apparatus that moves the panel.

On the other hand, in a non-contacting system, an obstacle is detected before actual contact occurs. One specific type of non-contacting obstacle detection system employs the use of a capacitive element(s) as a proximity sensor(s). Capacitive proximity sensors may include one or more electrical conductors formed along the leading edge of a moveable panel, as well as a capacitance sensitive circuit (e.g., a bridge circuit or an oscillator) coupled to the conductor(s). An obstacle (e.g., a human hand) in proximity to the conductor(s) changes the capacitance of the sensor, and the change is thereafter detected by the capacitive sensitive circuit.

Unfortunately, certain problems may arise in creating an appropriate capacitive proximity sensor having the requisite nominal, steady-state capacitance desired for high-sensitive applications, such as the non-contacting obstacle detecting system described above. First, the nominal capacitance value of a capacitive sensing device is inherently dependent upon (among other parameters) the physical dimensions and relative positions of the capacitor electrodes with respect to one another. More specifically, the degree to which the capacitor electrodes are dimensionally consistent with one another along their length will have an effect upon the characteristics of the device. Given the fact that a sensor could be located upon a contoured surface such as a vehicle pillar, panel or moveable lift-gate, the prospect of forming a reliable, sensitive capacitive proximity sensor can therefore be difficult.

Furthermore, it may also be desirable for the sensor to be located in a "tight" area that effectively limits the profile of the sensor, and/or provided in an outdoor setting (such as upon a motor vehicle) that is necessarily exposed to moisture. These variables also have an effect on capacitance and, as such, should be taken into account when designing a high-sensitivity, precision capacitive proximity sensor.

SUMMARY

The above discussed and other drawbacks and deficiencies of the prior art are overcome or alleviated by a capacitive sensor assembly. In an exemplary embodiment, the assembly includes a capacitive strip having an elongated body for flexible mounting to a panel along a bottom surface of the elongated body. A first elongated planar conductor is contained within an upper section of the elongated body, while a longitudinal cavity is formed through a central portion of the elongated body. The longitudinal cavity is disposed between the planar conductor and the bottom surface. A capacitance detector module is inserted within the longitudinal cavity, the capacitance detector module including a capacitance detector circuit therein that is coupled to the first elongated planar conductor.

In a preferred embodiment, the first elongated planar conductor is a first electrode of a sensing capacitor coupled to the capacitance detector circuit. The longitudinal cavity comprises a portion of a dielectric material of the sensing capacitor. In addition, the panel comprises a second electrode of the sensing capacitor. The planar conductor is preferably a flexible material, such that a substantially constant distance is maintained between the first elongated planar conductor and the panel. The elongated body is formed by extrusion of an insulating material such as santoprene rubber.

In another aspect, the capacitance detector module further includes a printed circuit board and a shielding structure for shielding radiated emissions generated by devices contained within the printed circuit board. A terminal clip electrically connects the printed circuit board with the first elongated planar conductor. A first end of the terminal clip is attached to a back side of said printed circuit board, and a second end of the terminal clip is attached to the first elongated planar conductor. The shielding structure further includes a first shield for shielding a first oscillator included within the printed circuit board, and a second shield for shielding a second oscillator included within the printed circuit board.

BRIEF DESCRIPTION OF THE DRAWINGS

Referring to the exemplary drawings wherein like elements are numbered alike in the several Figures:

FIG. 2b is a lateral cross-sectional view of an alternative embodiment of FIG. 2a;

DETAILED DESCRIPTION

A capacitive sensor assembly is disclosed herein. The capacitive sensor assembly is inexpensive to manufacture, and has a suitably low nominal capacitance (on the order of about 20 picofarads (pF), for example) while still maintaining three dimensional flexibility for mounting to a contoured surface such as on a motor vehicle. The sensor assembly is embodied by a flexible capacitive strip that has a relatively low profile so as to be able to fit between, for example, a vehicle pillar and a door that closes upon the pillar. The strip is preferably formed so as to provide moisture resistant protection for the electrode(s) contained therein. In a further aspect, the capacitive sensor strip is also configured for integrally housing capacitance detection circuitry therein. Thereby, the capacitive strip may be connected directly to the detection circuitry, providing additional advantages as described hereinafter.

Figure 1:
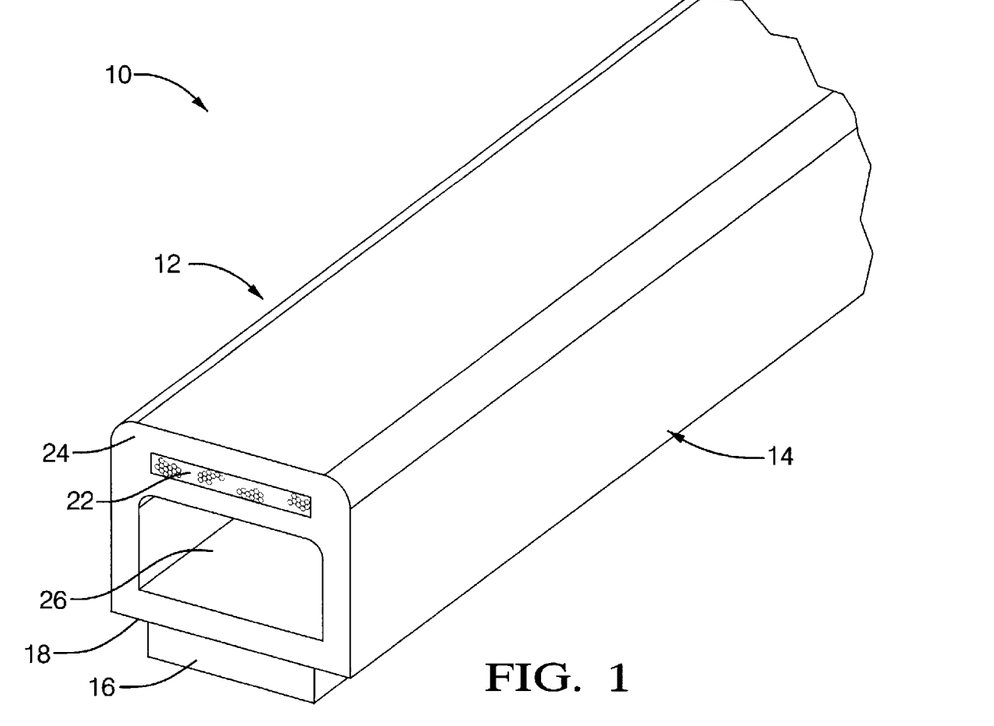
FIG. 1 is a partial perspective view of a flexible capacitive strip used in a capacitive sensor assembly, in accordance with an embodiment of the invention.
Figure 2A:
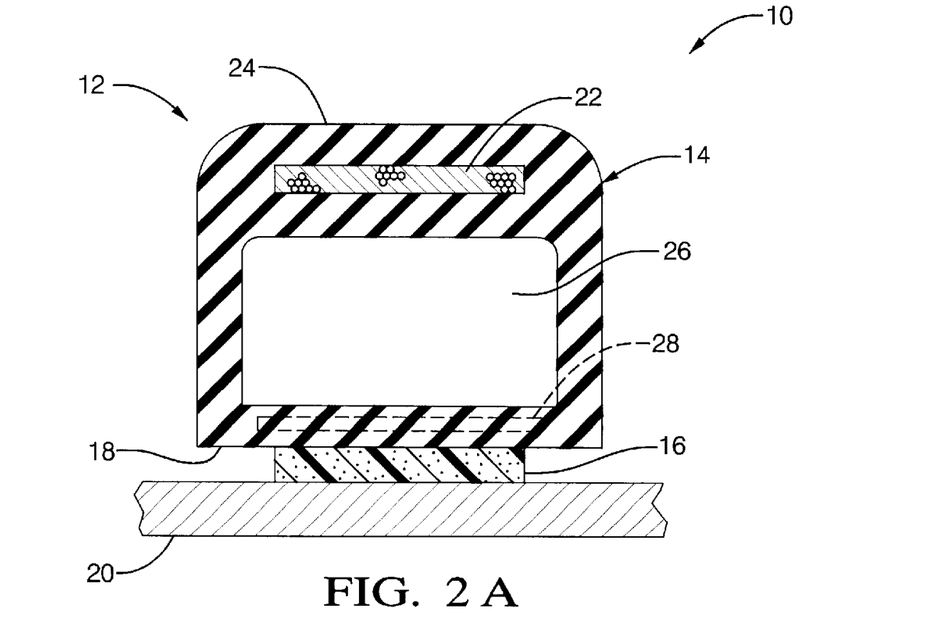
FIG. 2a is a lateral cross-sectional view of the capacitive strip of FIG. 1, shown mounted to a panel.

Referring initially to FIGS. 1 and 2a, there is shown a perspective and a lateral cross-sectional view (respectively) of a capacitive sensor assembly 10 including a flexible capacitive strip 12. In accordance with an embodiment of the invention, the sensor strip 12 has a flexible, elongated body 14 with an adhesive strip 16 affixed to a bottom surface 18. The adhesive strip 16 provides a means for securing the strip 12 to a metal panel 20 (e.g., a motor vehicle pillar or lift-gate). The sensor body 14 is preferably formed by extrusion of an insulating, flexible material such as santoprene rubber.

A flexible conductor 22 serves as a first electrode of the capacitive sensor assembly 10, and is insert molded into an upper portion 24 of the sensor body 14. The conductor 22 is further disposed substantially parallel to the bottom surface 18 and thus should be substantially parallel to the metal panel 20 when the strip 12 is attached thereto, regardless of the particular contours of the panel 20. Preferably, conductor 22 is a flat, braided conductor of tinned copper or the like so as to be flexible in any direction without being damaged, and without resulting in any change to its electrical characteristics along the length thereof. One example of a suitable choice for conductor 22 includes a flat tinned copper braid manufactured by the Alpha Wire Company. The santoprene rubber sensor body 14 covers the entire surface of the flat braid conductor 22 to prevent it from being exposed to moisture and, in addition, the extrusion of the rubber provides a cost effective method for producing several strips 12 (that may be cut to a desired length) from a single process.

In addition to containing the flexible conductor 22, the sensor body 14 further includes a central longitudinal cavity 26 between the upper portion 24 and the lower surface 18. In one aspect, the cavity 26 acts as an air core (i.e., dielectric) separating the conductor 22 from the metal panel 20. In this particular embodiment, the metal panel also serves as a second electrode or ground plane of the capacitive sensor assembly 10. However, it should also be appreciated that in applications where the strip 12 is to be affixed to a non-metallic panel or a non-metallic carrier, a second elongated conductor may be insert molded into the body 14 between the cavity 26 and the bottom surface 18, as is indicated in phantom by the conductor 28 in FIG. 2a.

Figure 2B:
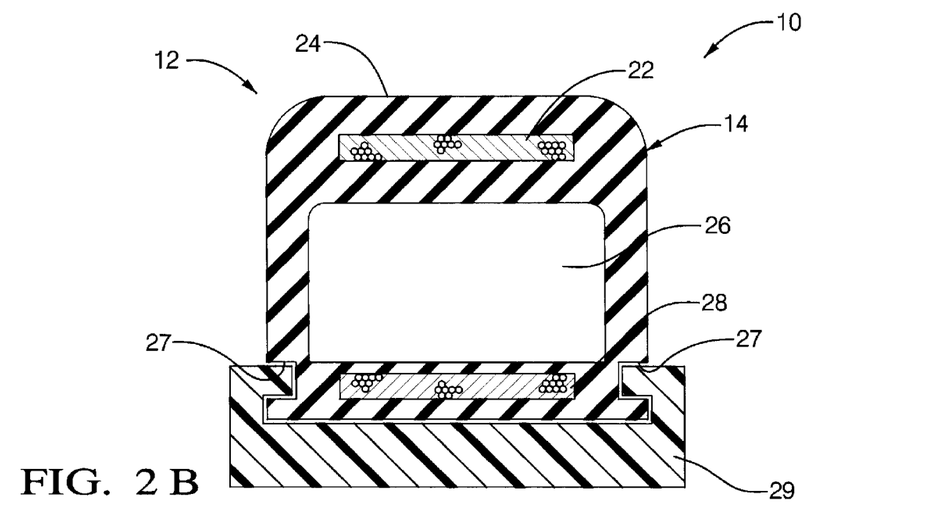

FIG. 2b illustrates an alternative embodiment of FIG. 2a. Instead of attaching the strip 12 to a metal panel by means of an adhesive strip, the sensor strip 12 may include grooves 27 formed within the outer sides of body 14. The strip 12 may then be slid (by way of grooves 27) into a plastic carrier 29 that holds the strip in place. In turn, the plastic carrier 29 may then be attached to a vehicle surface (not shown), for example, at an appropriate place. It will be noted, however, that in this embodiment, the conductor 28 is used as the second capacitor electrode as there is no direct contact between the strip 12 and a metal surface.

In general, the capacitance C of the sensor strip 12 may be determined from the following equation:

$$C = (\epsilon_0 \, \epsilon_r \, A)/d$$

where $\epsilon_0$ is the permittivity of free space (8.85 pF/m), $\epsilon_r$ is the relative permittivity (dielectric constant) of the material(s) used to form the strip body 14 (in this case, air and santoprene rubber), A is the surface area of the braided conductor 22, and d is the distance between the electrodes of the capacitor within the sensor assembly 10. In the embodiment wherein the panel 20 forms the ground plane of the strip 12, d is the distance from the braided conductor 22 to the panel 20. Alternatively, d is the distance from the braided conductor 22 to the second braided conductor 28.

Accordingly, it will be appreciated that the above described configuration for the capacitive strip 12 is advantageous in that its flexibility allows it to conform to the profile of a contoured surface such as a motor vehicle while still providing a uniformly shaped conductor therein that can remain substantially parallel to the contoured surface itself. Moreover, the santoprene rubber material, among other advantages, provides protection for the conductor from outside elements, such as moisture, which could otherwise adversely affect the sensitivity of the sensor assembly 10. It will further be noted that the size of the strip may be tailored according to the specific application, taking into consideration the value of capacitance desired to be used in the sensing circuitry. For example, a capacitive strip 12 intended for use in a capacitive proximity sensor for a motor vehicle lift gate may have a width of about 10 millimeters (mm) and a thickness or height of about 8 mm. Again, however, it will be understood that the general configuration for the capacitive strip may have several other applications and, thus, other sizes.

When the capacitive strip 12 is used in conjunction with some type of capacitance detection circuitry, an external connection may be needed to connect the conductor 22 to the circuitry. Accordingly, any external wire, lead, or other connection to conductor should also be provided with a sealing material so as to maintain the protection of the conductor 22 from moisture and other conditions. This is also the case for any end of the strip 12 that has been cut to a desired length; a cut end of the strip 12 is preferably also provided with a protective end mold (e.g., rubber) to seal the tip of the conductor 22.

In certain applications of capacitance detection systems, it may be the case that the sensing circuitry utilizes one or more high frequency (e.g., >900 MHz) oscillation devices to detect changes in capacitance. If the circuitry is located remotely from the capacitive strip 12 and relatively locally with respect to other electronic components and wiring, there is the possibility that radiated emissions from the oscillation devices could interfere with the other electronic components and associated wiring. While extensive shielding could be used in a control module, for example, to isolate multiple high frequency devices, it may also be desirable to locate a capacitance detector circuit in proximity with the capacitive strip 12 itself.

Therefore, in accordance with a further aspect of the invention, the sensing apparatus 10 is further provided with a high-sensitivity capacitance detector circuit module (hereinafter referred to as the HSCD module) integrated therein. Generally speaking, the packaging of the HSCD module is designed to be inserted into the central longitudinal cavity 26 of strip 12. Thereby, the HSCD may be directly connected to conductor 22 (i.e., capacitor electrode). In this manner, the potential for variation in nominal capacitance value is also reduced since there is no need for a length of external conductive wire to connect the strip 12 to a remotely located detector circuit.

Figures 3, 4:
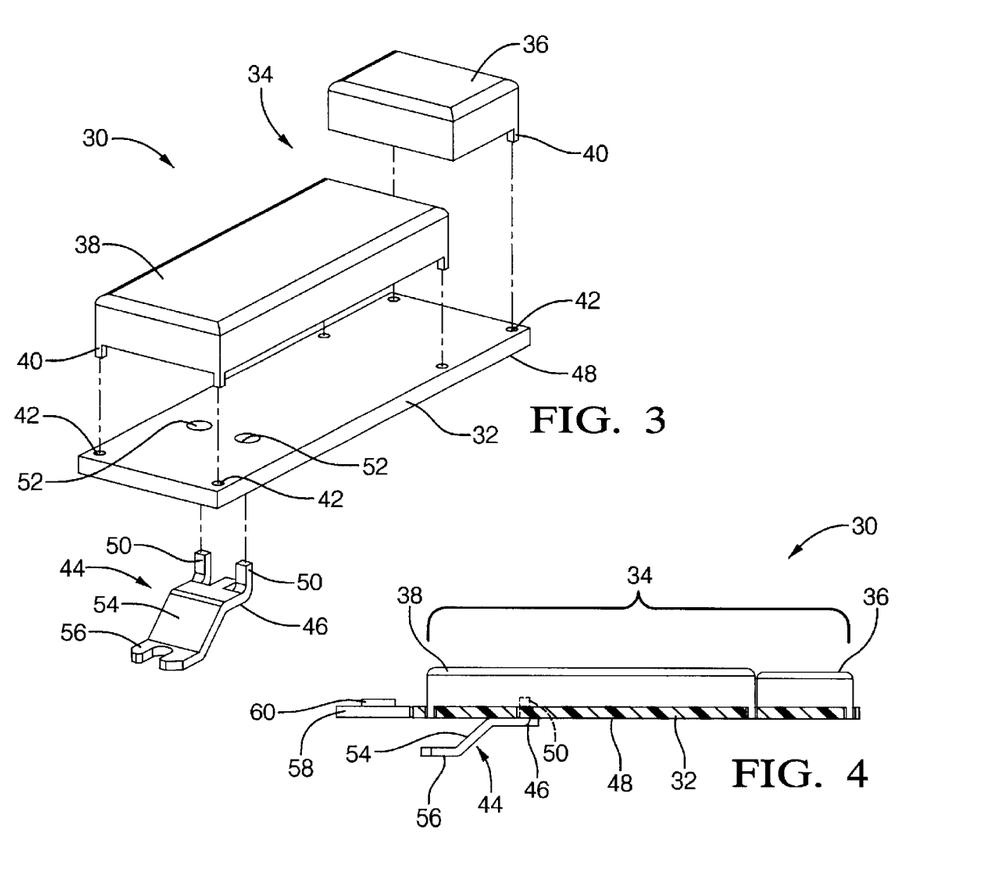
FIG. 3 is an exploded perspective view of capacitance detector module to be inserted within the flexible capacitive strip.
FIG. 4 is a side view of the capacitance detector module of FIG. 3.

Referring now to FIGS. 3 and 4, the HSCD module 30, in one possible embodiment, includes a printed circuit board 32 containing the individual HSCD circuit components (not shown) and interconnections therebetween. A shielding structure 34 includes a first shield 36 for shielding a first oscillator and a second shield 38 for shielding a second oscillator. For example, the HSCD module 30 may include one or more oscillator devices and, thus each device is provided with an individual shield. Both the first shield 36 and the second shield 38 include tabs 40 that are inserted into corresponding holes 42 within the printed circuit board 32.

In addition, the HSCD module 30 is further provided with a terminal clip 44 or connection mechanism for electrically connecting the conductor 22 within the capacitive strip 12 with the capacitance detection circuitry within the HSCD module 30. A first end 46 of the clip 44 is mounted to the back side 48 of the printed circuit board 32 by inserting the tabs 50 on the clip 44 through corresponding holes 52 in the printed circuit board 32 and then forming a solder connection. However, any suitable attachment means to the printed circuit board 32 is also contemplated, such as by crimping or pressing. The clip 44 further includes an angled portion 54 that terminates in a second, horseshoe shaped end 56. In turn, the second end 56 is configured to be connected to the conductor 22 within the capacitive strip 12, as will be shown in further detail hereinafter. However, the second end 56 need not be horseshoe shaped, so long as the connection results in a consistent, steady state capacitance value.

As shown in FIG. 4, an extension 58 may also be provided with printed circuit board 32. Extension 58 includes a connection port 60 that is configured for receiving a signal and power connection from a control module (not shown) to interface with the capacitance detector circuitry.

Figure 5:
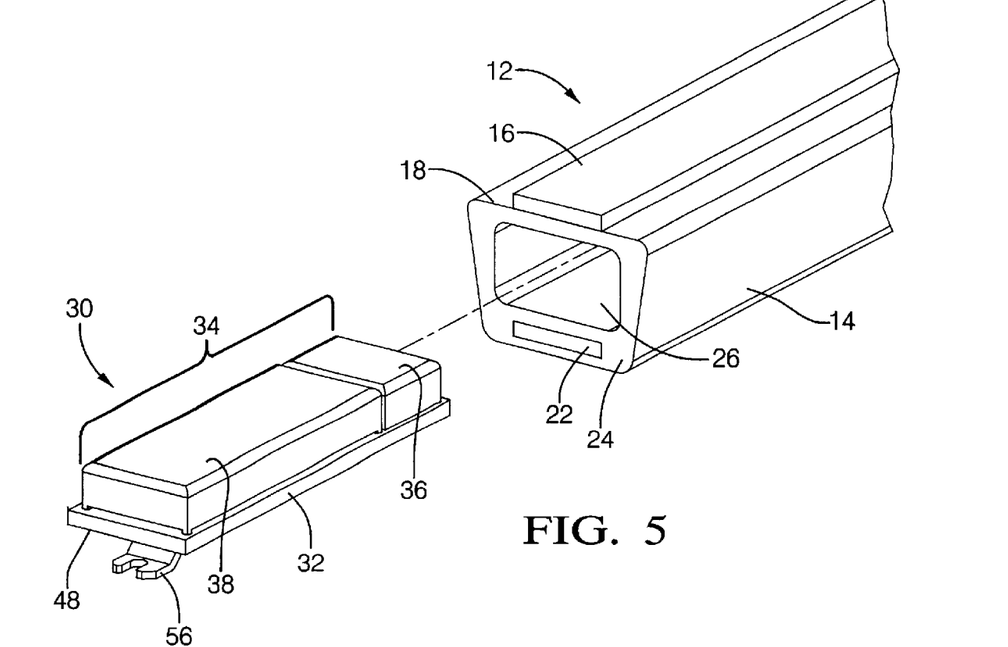
FIG. 5 is a perspective view of both the capacitance detector module and the capacitive strip, illustrating the positional orientation of the insertion of the capacitance detector module into the capacitive strip.

Referring now to FIG. 5, there is shown a perspective view of both the HSCD module 30 (shown without extension 58 and connection port 60) and the capacitive strip 12, particularly illustrating the positional relationship therebetween when the module 30 is inserted within the cavity 26 of the strip 12. It will be noted that the strip 12 is "inverted" with respect to the module 30 and vice versa. In other words, the bottom surface 18 of the strip 12 is nearest the top of the shielding structure 34.

Figure 6:
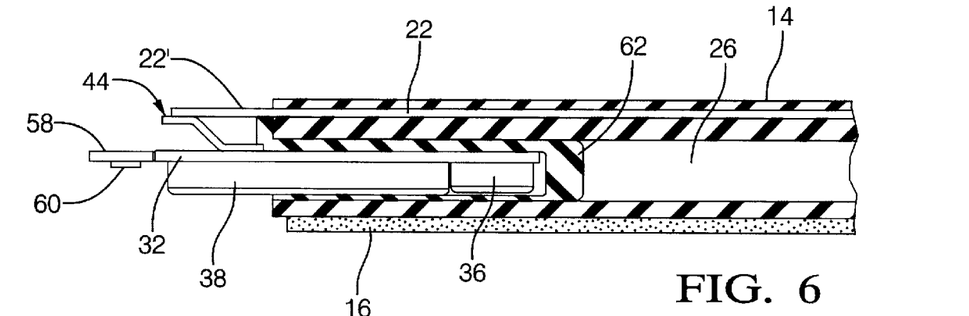
FIG. 6 is a side cross-sectional view of the capacitance detector module inserted within the capacitive strip to form the capacitive sensor assembly.

FIG. 6 illustrates the inserted module 30 within the strip 12. However, prior to the insertion, the HSCD module 30 is first inserted into a rubber boot 62. The rubber boot 62 serves to secure the HSCD module 30 snugly within the cavity 26 of the strip, since the overall shape of the module 30 might not be identical with the shape of the cavity 26. The boot 62 will also serve to prevent the leakage of rubber inside the strip 12 when the end thereof is over-molded to seal the HSCD module 30 and the external connection thereto.

Figure 7:
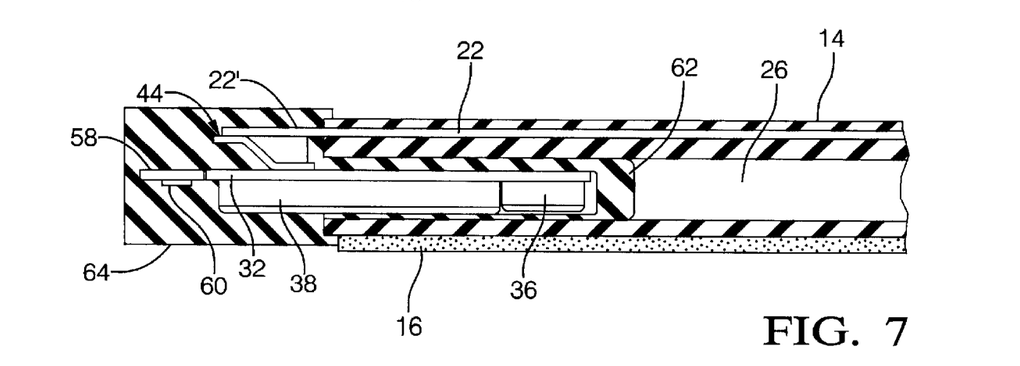
FIG. 7 is another side cross-sectional view of the capacitance detector module inserted within the capacitive strip, further illustrating an end mold covering over the protruding end of the capacitance detector module and capacitor electrode.

In order to make the connection between the terminal clip and the conductor 22, a portion 22' (e.g., about 8 mm) of the conductor 22 is exposed. This may be done during the extrusion process as the strip 12 is cut to its desired length. Thus, when the HSCD module 30 and covering boot 62 is inserted within the cavity 26 of the strip, the second end 56 of the terminal clip 44 is brought into contact with exposed portion 22' of conductor 22. A soldering process may then be implemented to assure good electrical connection between the conductor 22 and the terminal clip 44. The horseshoe configuration of second end 56 allows for easy solder flow to make the connection. Then, the longitudinal ends (only one shown) of the strip 12 are over-molded to form the insulative end caps 64 (only one shown) in FIG. 7. The end 64 prevents moisture from entering the capacitive strip 12, as well as provides environmental protection for the protruding end of the HSCD module 30.

Figure 8:
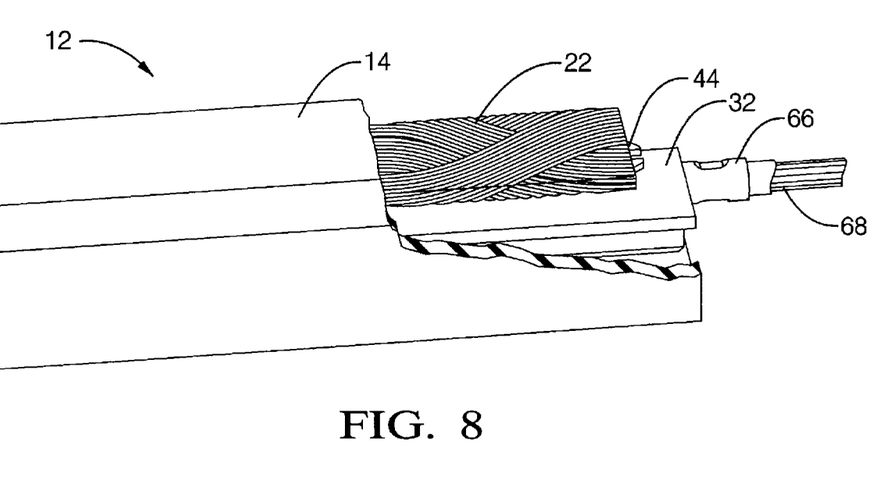
FIG. 8 is a perspective, cut away view of an alternative embodiment of the capacitive sensor assembly, further illustrating a coaxial cable and connector.

FIG. 8 illustrates still an alternative embodiment of the inserted module 30 within the strip 12. A coaxial cable connector 66 and associated cable 68 may be used to both provide power to the HSCD module 30 and to transmit the signals generated therein. The coaxial cable 68 is a preferred, lower cost alternative to multiple wiring configurations.

Figure 9:
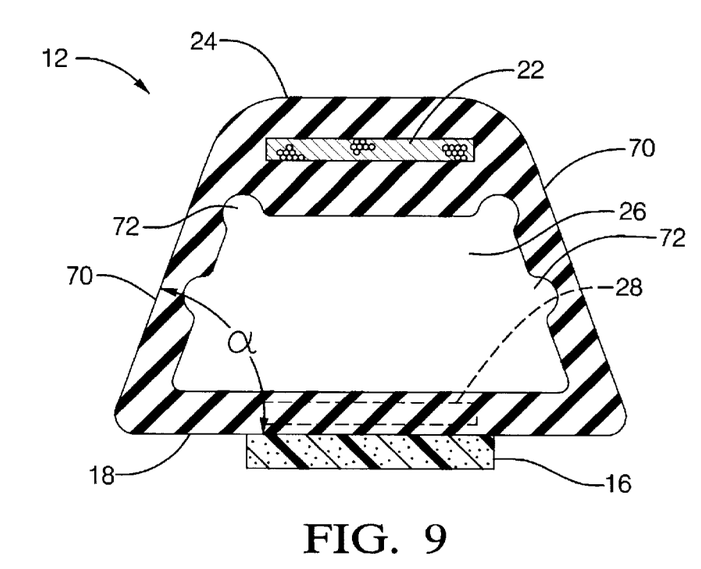
FIG. 9 is an end view of an alternative embodiment of the capacitive strip.

Finally, FIG. 9 illustrates an end view of an alternative embodiment of the capacitive strip 12. The capacitive strip 12 may have a cross section that is generally trapezoidal in shape, wherein the side surfaces 70 of the strip are upwardly tapered as determined by an acute angle, $\alpha$, with respect to the bottom surface 18. In addition, the cavity 26 may be formed to include curved protrusions 72 within the material of the strip 12. Thus configured, strip 12 may be made more resistant to inward compression of the side surfaces 66. If pressure is applied to the upper portion 24 of the strip 12, the upper portion 24 will move straight downward, but will more readily return to its original position when the compressive force is removed.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A capacitive sensor assembly comprising:
   a capacitive strip having an elongated body for flexible mounting to a panel along a bottom surface of said elongated body;
   a first elongated planar conductor contained within an upper section of said elongated body;
   a longitudinal cavity formed through a central portion of said elongated body, said longitudinal cavity being disposed between said planar conductor and said bottom surface; and a capacitance detector module inserted within said longitudinal cavity, said capacitance detector module including a capacitance detector circuit therein;

wherein said capacitance detector circuit is coupled to said first elongated planar conductor, wherein said first elongated planar conductor comprises a first electrode of a sensing capacitor coupled to said capacitance detector circuit, and said longitudinal cavity comprises a portion of a dielectric material of said sensing capacitor, wherein said elongated body is formed by extrusion of an insulating material and, wherein said insulating material further comprises santoprene rubber.

2. The capacitive sensor assembly of claim 1, wherein a dielectric constant of said capacitive strip is determined by both said longitudinal cavity and said santoprene rubber.

3. The capacitive sensor assembly of claim 1, wherein the capacitive sensor assembly is configured for use in a non-contact obstacle detection system of a vehicle.

4. A capacitive sensor assembly comprising:
- a capacitive strip having an elongated body for flexible mounting to a panel along a bottom surface of said elongated body;
- a first elongated planar conductor contained within an upper section of said elongated body;
- a longitudinal cavity formed through a central portion of said elongated body, said longitudinal cavity being disposed between said planar conductor and said bottom surface; and
- a capacitance detector module inserted within said longitudinal cavity, said capacitance detector module including a capacitance detector circuit therein; wherein said capacitance detector circuit is coupled to said first elongated planar conductor and said first elongated planar conductor comprises a first electrode of a sensing capacitor coupled to said capacitance detector circuit, and said longitudinal cavity comprises a portion of a dielectric material of said sensing capacitor, wherein said elongated body includes a pair of grooves therein, said grooves thereby allowing said elongated body to be slid into and mounted within a carrier.

5. The capacitive sensor assembly of claim 4, further comprising an adhesive strip affixed to said bottom surface of said elongated body.

6. The capacitive sensor assembly of claim 4, wherein the capacitive sensor assembly is configured for use in a non-contact obstacle detection system of a vehicle.

7. A capacitive sensor assembly comprising:
- a capacitive strip having an elongated body for flexible mounting to a panel along a bottom surface of said elongated body;
- a first elongated planar conductor contained within an upper section of said elongated body;
- a longitudinal cavity formed through a central portion of said elongated body, said longitudinal cavity being disposed between said planar conductor and said bottom surface; and
- a capacitance detector module inserted within said longitudinal cavity, said capacitance detector module including a capacitance detector circuit therein, said first elongated planar conductor comprises a first electrode of a sensing capacitor coupled to said capacitance detector circuit, and said longitudinal cavity comprises a portion of a dielectric material of said sensing capacitor, said capacitance detector circuit being coupled to said first elongated planar conductor, wherein said elongated body is formed by extrusion of an insulating material and said insulating material surrounds said first elongated planar conductor.

8. The capacitive sensor assembly of claim 7, wherein said panel comprises a second electrode of said sensing capacitor.

9. The capacitive sensor assembly of claim 8, wherein said planar conductor comprises a flexible material such that a substantially constant distance is maintained between said first elongated planar conductor and said panel.

10. The capacitive sensor assembly of claim 7, wherein said first elongated planar conductor further comprises braided wire.

11. The capacitive sensor assembly of claim 10, wherein said braided wire is formed from tinned copper material.

12. The capacitive sensor assembly of claim 7, further comprising an adhesive strip affixed to said bottom surface of said elongated body.

13. The capacitive sensor assembly of claim 7, wherein the capacitive sensor assembly is configured for use in a non-contact obstacle detection system of a vehicle.

14. A capacitive sensor assembly comprising:
- a capacitive strip having an elongated body for flexible mounting to a panel along a bottom surface of said elongated body;
- a first elongated planar conductor contained within an upper section of said elongated body;
- a longitudinal cavity formed through a central portion of said elongated body, said longitudinal cavity being disposed between said planar conductor and said bottom surface; and
- a capacitance detector module inserted within said longitudinal cavity, said capacitance detector module including a capacitance detector circuit therein;
- wherein said capacitance detector circuit is coupled to said first elongated planar conductor and said capacitance detector module comprises:
  - a printed circuit board;
  - a shielding structure for shielding radiated emissions generated by devices contained within said printed circuit board; and
  - a connection mechanism for electrically connecting said printed circuit board with said first elongated planar conductor.

15. The capacitive sensor assembly of claim 14, wherein said connection mechanism further comprises:
- a terminal clip having a first end attached to a back side of said printed circuit board; and
- a second end of said terminal clip is attached to said first elongated planar conductor.

16. The capacitive sensor assembly of claim 15, wherein said second end of said terminal clip is generally horseshoe shaped.

17. The capacitive sensor assembly of claim 14, wherein said shielding structure further comprises:
- a first shield for shielding a first oscillator included within said printed circuit board; and
- a second shield for shielding a second oscillator included within said printed circuit board.

18. The capacitive sensor assembly of claim 14, further comprising:

a rubber boot, said rubber boot being formed over a first end of said capacitance detector module prior to insertion of said capacitance detector module into said longitudinal cavity of said elongated body.

19. The capacitive sensor assembly of claim 14, wherein said capacitance detector module further comprises:

a coaxial cable and connector, connected to said printed circuit board, said coaxial cable capable of delivering power to said capacitance detector module, and transmitting signals generated within said capacitance detector module.

20. The capacitive sensor assembly of claim 14, further comprising an adhesive strip affixed to said bottom surface of said elongated body.

21. The capacitive sensor assembly of claim 14, wherein the capacitive sensor assembly is configured for use in a non-contact obstacle detection system of a vehicle.

* * * * *